(12) United States Patent
Akram et al.

(10) Patent No.: US 7,095,106 B2
(45) Date of Patent: *Aug. 22, 2006

(54) COLLARS, SUPPORT STRUCTURES, AND FORMS FOR PROTRUDING CONDUCTIVE STRUCTURES

(75) Inventors: Salman Akram, Boise, ID (US); Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/169,230

(22) Filed: Jun. 28, 2005

(65) Prior Publication Data

US 2006/0017175 A1    Jan. 26, 2006

Related U.S. Application Data

(63) Continuation of application No. 10/107,848, filed on Mar. 27, 2002, now Pat. No. 6,911,735, which is a continuation of application No. 09/590,418, filed on Jun. 8, 2000, now Pat. No. 6,569,753.

(51) Int. Cl.
*H01L 23/48* (2006.01)

(52) U.S. Cl. .................................. 257/690; 257/737

(58) Field of Classification Search ................ 257/686, 257/688, 690, 734, 737, 738, 778, 779, 781
See application file for complete search history.

(56) References Cited

U.S. PATENT DOCUMENTS

| | | | |
|---|---|---|---|
| 5,173,220 A | 12/1992 | Reiff et al. | |
| 5,264,061 A | 11/1993 | Juskey et al. | |
| 5,278,442 A | 1/1994 | Prinz et al. | |
| 5,281,684 A | 1/1994 | Moore et al. | |
| 5,484,314 A | 1/1996 | Farnworth | |
| 5,545,367 A | 8/1996 | Bae et al. | |
| 5,608,260 A | 3/1997 | Carper et al. | |
| 5,641,113 A | 6/1997 | Somaki et al. | |
| 5,705,117 A | 1/1998 | O'Connor et al. | |
| 5,834,366 A | 11/1998 | Akram | |
| 5,915,170 A | 6/1999 | Raab et al. | |
| 5,924,003 A | 7/1999 | Slocum | |
| 5,934,545 A | 8/1999 | Gordon | |
| 5,977,632 A | 11/1999 | Beddingfield | |
| 6,013,571 A | 1/2000 | Morrell | |
| 6,110,760 A | 8/2000 | Medlen et al. | |
| 6,118,179 A | 9/2000 | Farnworth et al. | |
| 6,143,639 A | 11/2000 | Medlen et al. | |
| 6,180,504 B1 | 1/2001 | Farnworth et al. | |
| 6,191,489 B1 | 2/2001 | Igel et al. | |
| 6,251,488 B1 | 6/2001 | Miller et al. | |
| 6,259,962 B1 | 7/2001 | Gothait | |
| 6,268,584 B1 | 7/2001 | Keicher et al. | |

(Continued)

OTHER PUBLICATIONS

Miller et al., "Maskless Mesoscale Materials Deposition", Deposition Technology, Sep. 2001, pp. 20-22.

(Continued)

*Primary Examiner*—Scott B. Geyer
(74) *Attorney, Agent, or Firm*—TraskBritt

(57) ABSTRACT

Collars, support structures, or forms for protruding conductive structures include apertures or receptacles through which the conductive structure may extend. The aperture or receptacle may be configured to contact a surface of the conductive structure, and even to define a shape of at least a portion of the conductive structure. Each collar, support structure, or form may include a plurality of adjacent, mutually adhered regions.

28 Claims, 6 Drawing Sheets

U.S. PATENT DOCUMENTS

| | | |
|---|---|---|
| 6,274,473 B1 | 8/2001 | Blish et al. |
| 6,274,474 B1 | 8/2001 | Caletka et al. |
| 6,297,141 B1 | 10/2001 | Miyazaki |
| 6,297,560 B1 | 10/2001 | Capote et al. |
| 6,297,562 B1 | 10/2001 | Tilly |
| 6,326,698 B1 | 12/2001 | Akram |
| 6,333,104 B1 | 12/2001 | Perry et al. |
| 6,344,695 B1 | 2/2002 | Murayama |
| 6,352,881 B1 | 3/2002 | Nguyen et al. |
| 6,391,251 B1 | 5/2002 | Keicher et al. |
| 6,461,881 B1 | 10/2002 | Farnworth et al. |
| 6,476,502 B1 | 11/2002 | Yamada et al. |
| 6,506,671 B1 | 1/2003 | Grigg |
| 6,524,346 B1 | 2/2003 | Farnworth |
| 6,544,821 B1 | 4/2003 | Akram |
| 6,548,897 B1 | 4/2003 | Grigg |
| 6,583,354 B1 | 6/2003 | Alcoe |
| 6,630,365 B1 | 10/2003 | Farnworth et al. |
| 6,649,444 B1 | 11/2003 | Farnworth et al. |
| 6,773,957 B1 | 8/2004 | Farnworth et al. |
| 6,861,763 B1 | 3/2005 | Akram |
| 6,882,049 B1 | 4/2005 | Grigg |
| 6,893,904 B1 | 5/2005 | Akram |
| 6,911,735 B1 * | 6/2005 | Akram et al. ............... 257/734 |
| 2002/0043711 A1 | 4/2002 | Akram et al. |
| 2002/0171177 A1 | 11/2002 | Kritchman et al. |
| 2003/0043360 A1 | 3/2003 | Farnworth |
| 2003/0102566 A1 | 6/2003 | Farnworth |
| 2003/0139030 A1 | 7/2003 | Grigg |
| 2003/0151167 A1 | 8/2003 | Kritchman et al. |
| 2003/0170921 A1 | 9/2003 | Akram |
| 2003/0176016 A1 | 9/2003 | Grigg |
| 2003/0207213 A1 | 11/2003 | Farnwoth |
| 2004/0014255 A1 | 1/2004 | Grigg et al. |
| 2004/0080027 A1 | 4/2004 | Grigg et al. |
| 2004/0142058 A1 | 7/2004 | Farnworth |

OTHER PUBLICATIONS

Miller, "New Laser-Directed Deposition Technology", Microelectronic Fabrication, Aug. 2001, p. 16.

Webpage, Objet Prototyping the Future, Objet FullCure700 Series, 1 page.

Webpage, Objet Prototyping the Future, Objet How it Works, 2 pages.

U.S. Appl. No. 09/590,527, filed Jun. 8, 2000, entitled "Structures for Stabilizing Semiconductor Devices Relative to Test Substrates and Methods for Fabricating the Stabilizers", inventor Salman Akram.

U.S. Appl. No. 09/590,621, filed Jun. 8, 2000, entitled "Stereolithographic Method and Apparatus for Fabricating Stabilizers for Flip-Chip Type Semiconductor Devices and Resulting Structures", inventor Akram et al.

U.S. Appl. No. 09/590,646, filed Jun. 8, 2000, entitled "Reinforced, Self-Aligning Conductive Structures for Semiconductor Device Components and Methods for Fabricating Same", inventor Williams et al.

* cited by examiner

COLLARS, SUPPORT STRUCTURES, AND FORMS FOR PROTRUDING CONDUCTIVE STRUCTURES

CROSS-REFERENCE TO RELATED APPLICATIONS

This application is a continuation of application Ser. No. 10/107,848, filed Mar. 27, 2002, now U.S. Pat. No. 6,911,735, issued Jun. 28, 2005, which is a continuation of application Ser. No. 09/590,418, filed Jun. 8, 2000, now U.S. Pat. No. 6,569,753, issued May 27, 2003.

BACKGROUND OF THE INVENTION

1. Field of the Invention

The present invention relates generally to semiconductor devices having collars disposed about the peripheries of the contact pads thereof and, more specifically, to the use of stereolithography to fabricate such collars around the contact pads prior to securing conductive structures to the contact pads. Particularly, the present invention pertains to collars disposed about the peripheries of the contact pads of a semiconductor device component for enhancing the reliability of conductive structures secured to the contact pads. The present invention also relates to semiconductor device components including such collars.

Reliability of Conductive Structures Used to Connect a Semiconductor Device Face Down to a Higher Level Substrate 2. Background of the Art Some types of semiconductor devices, such as flip-chip type semiconductor dice, including ball grid array (BGA) packages and chip-scale packages (CSPs), can be connected to higher level substrates by orienting these semiconductor devices face down over the higher level substrate. The contact pads of such semiconductor devices are typically connected directly to corresponding contact pads of the higher level substrate by solder balls or other discrete conductive elements.

Examples of materials that are known in the art to be useful in connecting semiconductor devices face down to higher level substrates include, but are not limited to, lead-tin (Pb/Sn) solder, tin-silver (Sn/Ag) solder, tin-silver-nickel (Sn/Ag/Ni) solder, copper, gold, and conductive polymers. For example, 95/5 type Pb/Sn solder bumps (i.e., solder having about 95% by weight lead and about 5% by weight tin) have been used in flip-chip, ball grid array, and chip-scale packaging type attachments.

When 95/5 type Pb/Sn solder bumps are employed as conductive structures to form a direct connection between a contact pad of a semiconductor device and a contact pad of a higher level substrate, a quantity of solder paste, such as 63/37 type Pb/Sn solder, can be applied to the contact pad of the higher level substrate to facilitate bonding of the solder bump thereto. As the 95/5 type Pb/Sn solder and the 63/37 type Pb/Sn solder are heated to bond the solder bump to a contact pad of the higher level substrate, the 95/5 type Pb/Sn solder, which has a higher melting temperature than the 63/37 type Pb/Sn solder, softens when the 63/37 type Pb/Sn solder is reflowed. When the 95/5 type Pb/Sn solder softens, the gravitational or compressive forces holding the semiconductor device in position over the higher level substrate can cause the softened 95/5 type Pb/Sn solder bump to flatten, pushing the solder laterally outward onto portions of the surface of the semiconductor device that surround the contact pad to which the solder bump is secured and, in the case of fine pitch or spacing of balls, into the solder of an adjacent ball.

Assemblies that include semiconductor devices connected face down to higher level substrates using solder balls are subjected to thermal cycling during subsequent processing, burn-in, testing thereof, and in normal use. As these assemblies undergo thermal cycling, the solder balls thereof are also exposed to wide ranges of temperatures, causing the solder balls to expand when heated and contract when cooled. Repeated variations in temperatures can cause solder fatigue, which can reduce the strength of the solder balls, cause the solder balls to fail, and diminish the reliability of the solder balls. The high temperatures to which solder balls are exposed during burn-in and thermal cycling can also soften and alter the conformations of the conductive structures.

The use of other conductive structures, which have more desirable shapes, such as pillars, or columns, and mushroom-type shapes, and consume less conductive material than solder balls, to connect semiconductor devices face down to higher level substrates has been limited since taller and thinner conductive structures may not retain their shapes upon being bonded to the contact pads of a higher level substrate or in thermal cycling of the semiconductor device assembly.

The likelihood that a solder ball will be damaged by thermal cycling is particularly high when the solder ball spreads over and contacts the surface of the semiconductor device or the higher level substrate. Flattened solder balls and solder balls that contact regions of the surface of a semiconductor device that surround the contact pads thereof are particularly susceptible to the types of damage that can be caused by thermal cycling of the semiconductor device.

In an attempt to increase the reliability with which solder balls connect semiconductor devices face down to higher level substrates, resins have been applied to semiconductor devices to form collars around the bases of the solder balls protruding from the semiconductor devices. These resinous supports laterally contact the bases of the solder balls to enhance the reliability thereof. The resinous supports are applied to a semiconductor device after solder balls have been secured to the contact pads of the semiconductor device and before the semiconductor device is connected face down to a higher level substrate. As those of skill in the art are aware, however, the shapes of solder balls can change when bonded to the contact pads of a substrate, particularly after reflow of the solder balls. If the shapes of the solder balls change, the solder balls can fail to maintain contact with the resinous supports, which could thereby fail to protect or enhance the reliability of the solder balls.

The use of solder balls in connecting a semiconductor device face down to higher level substrates is also somewhat undesirable from the standpoint that, due to their generally spherical shapes, solder balls consume a great deal of area, or "real estate," on a semiconductor device. Thus, solder balls can limit the spacing between the adjacent contact pads of a semiconductor device and, thus, the pitch of the contact pads on the semiconductor device.

Moreover, when solder balls are reflowed, a phenomenon referred to as "outgassing" occurs, which can damage a semiconductor device proximate to the solder balls.

The inventors are not aware of any art that discloses peripheral collars that may be disposed individually around the contact pads of a semiconductor device so as to, at least in part, define the shapes of conductive structures to be bonded to the contact pads or to facilitate bonding of a conductive structure to a bond pad without completely reflowing the material of the conductive structures. Moreover, the inventors are not aware of methods that can be used to fabricate collars around either bare contact pads or contact pads having conductive structures protruding therefrom.

Stereolithography

In the past decade, a manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries. This is followed by selective consolidation or fixation of the material to at least a partially consolidated, or semisolid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form and the material itself may be consolidated or fixed, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size. When a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for the same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventors' knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to fabricate peripheral collars around the contact pads of semiconductor devices, such as flip-chip type semiconductor devices or ball grid array packages. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes a dielectric collar that surrounds the periphery of a contact pad of a semiconductor device, semiconductor device components including such collars, and methods for fabricating the collars. The present invention also includes forming conductive structures of desired configurations with the collars, as well as other methods for using the collars of the present invention.

A collar incorporating teachings of the present invention surrounds the periphery of a contact pad exposed at the surface of a semiconductor device component, such as a semiconductor die, a chip-scale package substrate, or a carrier substrate. The collar protrudes from the surface of the semiconductor device component. If the collar is fabricated before a conductive structure is secured to the contact pad, at least a portion of the surrounded contact pad is exposed through an aperture defined by the collar. The aperture of the collar may be configured to impart at least a base portion of a conductive structure to be bonded or otherwise secured to the contact pad with a desired shape and dimensions.

Conductive structures of any useful configuration can be used with or defined by the collar of the present invention. Exemplary configurations of conductive structures that can be used with or defined by the collar include, but are not limited to, balls, bumps, pillars or columns, mushroom shapes, or other shapes. These conductive structures can be fabricated from solders, metals, metal alloys, conductor filled epoxies, conductive epoxies, and other conductive materials that are suitable for use with semiconductor devices.

As the collar of the present invention facilitates the use of conductive structures having shapes other than that of a solder ball, alternatively shaped, thinner conductive structures can be spaced more closely, facilitating a decrease in the possible pitch of contact pads on a semiconductor device component. In addition, some alternatively configured conductive structures, such as pillars and mushrooms, require less material than balls.

Since the collar protrudes from the surface of the semiconductor device component, when a conductive structure is bonded or otherwise secured to the contact pad exposed through the collar, the collar laterally surrounds at least a portion of the conductive structure. Accordingly, when a conductive structure is formed on or secured to a contact pad, or during bonding of the conductive structure to the contact pad of another device or substrate, the contact pad collar of the present invention laterally contains at least a base portion of a conductive structure extending therethrough and prevents the material of the conductive structure from contacting and wetting portions of the surface of the semiconductor device component adjacent to the contact pad.

The collar is preferably configured to contact a conductive structure extending therethrough so as to laterally support and protect at least the contacted portion of the conductive structure during thermal cycling of the semiconductor device, such as in the repeated use thereof.

In addition, use of collars according to the present invention, which may be of substantial height or protrusion from a substrate so as to encompass the conductive structures at or approaching their heights, may eliminate the need for an insulative underfill conventionally applied between a die and a higher level substrate.

Another significant advantage of the collars of the present invention is the containment of the conductive material of the conductive structures, in the manner of a dam, during connection of a semiconductor device face down upon a higher level substrate, thus preventing contamination or wetting of the passivation layer surrounding the contact pads.

According to another aspect, the present invention includes a method for fabricating the collar. In a preferred embodiment of the method, a computer-controlled, 3-D CAD-initiated process known as "stereolithography" or "layered manufacturing" is used to fabricate the collar. When stereolithographic processes are employed, each collar is formed as either a single layer or a series of superimposed, contiguous, mutually adhered layers of material.

The stereolithographic method of fabricating the collars of the present invention preferably includes the use of a machine vision system to locate the semiconductor devices or other substrates on which the collars are to be fabricated, as well as the features or other components on or associated with the semiconductor devices or other substrates (e.g., solder bumps, contact pads, conductor traces, etc.). The use of a machine vision system directs the alignment of a stereolithography system with each semiconductor device or other substrate for material disposition purposes. Accordingly, the semiconductor devices or other substrates need not be precisely mechanically aligned with any component of the stereolithography system to practice the stereolithographic embodiment of the method of the present invention.

In a preferred embodiment, the collars to be fabricated upon or positioned upon and secured to a semiconductor device component in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or other substrate.

The collars of the present invention may be fabricated around the contact pads of the semiconductor device component either before or after conductive structures are bonded or otherwise secured to the contact pads, although it is preferred that the collars be fabricated before securing the conductive structures to the contact pads.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The accompanying drawings illustrate exemplary embodiments of the invention, wherein some dimensions may be exaggerated for the sake of clarity, and wherein.

DETAILED DESCRIPTION OF THE INVENTION

Collars

Figure 1:
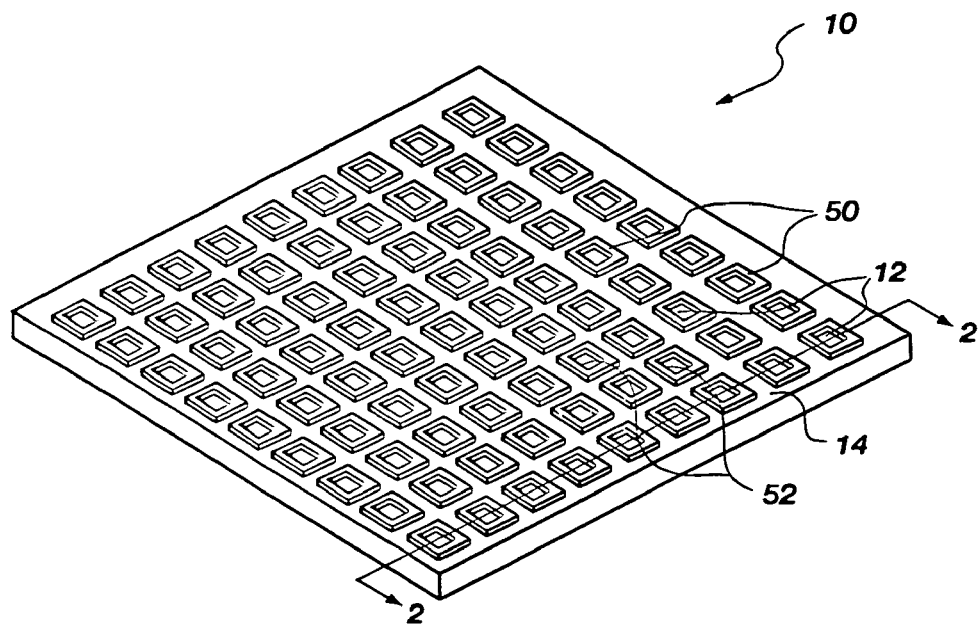
FIG. 1 is an enlarged perspective view of a semiconductor device having collars positioned around the exposed contact pads thereof.
Figure 2:
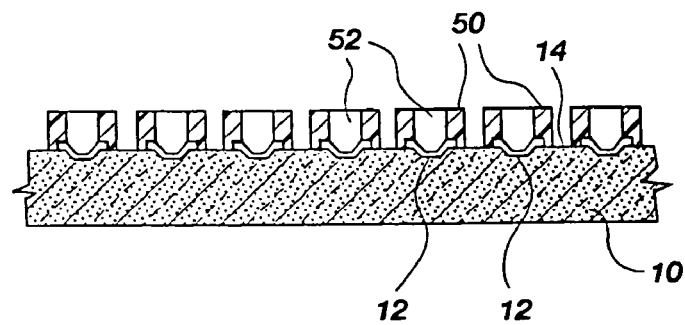
FIG. 2 is a cross-section taken along line 2—2 of FIG. 1, depicting the apertures of the collars.

With reference to FIGS. 1 and 2, a semiconductor device 10 having contact pads 12 on a surface 14 thereof is illustrated. Semiconductor device 10 can be a semiconductor die, a chip-scale package, a ball grid array package, a carrier substrate, or any other type of semiconductor device component having contact pads to which conductive structures, such as balls, bumps, or pillars, can be attached.

As illustrated, a collar 50 surrounds the periphery of each contact pad 12. Each collar 50 has an aperture 52, through which at least a portion of the surrounded contact pad 12 is exposed. Each collar 50 protrudes from surface 14 of semiconductor device 10 so as to laterally surround at least a portion of a conductive structure to be bonded or otherwise secured to contact pad 12 and to prevent the material of a conductive structure from contacting portions of surface 14 adjacent to contact pad 12.

Figure 3:
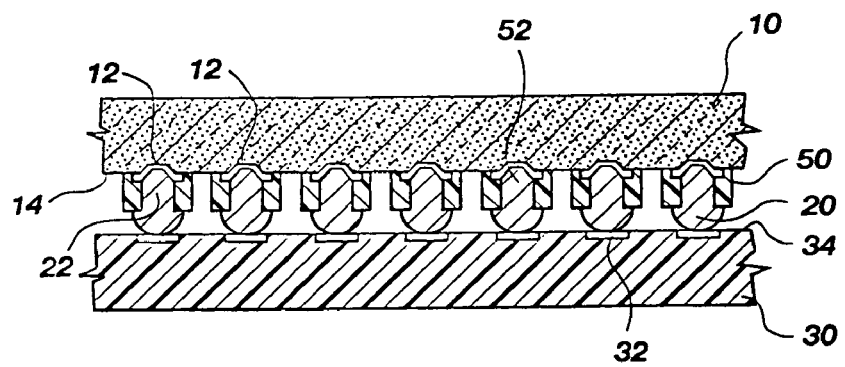
FIG. 3 is a cross-sectional view illustrating the face down connection of the semiconductor device of FIGS. 1 and 2 to a higher level substrate.

Referring now to FIG. 3, semiconductor device 10 is shown in a face down orientation over a higher level substrate 30. Substrate 30 has contact pads 32, or terminals, exposed at a surface 34 thereof. Contact pads 32 are preferably arranged so as to align with corresponding ones of contact pads 12 upon positioning semiconductor device 10 face down over substrate 30. Each contact pad 12 of semiconductor device 10 is electrically connected to its corresponding contact pad 32 of substrate 30 by way of a conductive structure 20, such as a bump, ball, or pillar, formed from a conductive material, such as a solder, other metal or metal alloy, a conductor filled epoxy, or a conductive epoxy.

As will be explained in greater detail below, collars 50 are at least partially fabricated prior to connecting conductive structures 20 to contact pads 12. As depicted in FIG. 3, a base portion 22 of each conductive structure 20, which is bonded or otherwise secured to the contact pad 12 exposed through aperture 52 of collar 50, has a shape that is complementary to the configuration of aperture 52. Thus, each collar 50 contacts the conductive structure 20 that extends through aperture 52. Base portion 22 of each conductive structure 20 can have a shape that is defined by aperture 52 or that is configured complementarily to aperture 52. Accordingly, collars 50 and the apertures 52 thereof can be configured to impart desired shapes and dimensions to conductive structures 20 or at least base portion 22 thereof.

Alternatively, conductive structures 20 can have base portions 22 that are not shaped complementarily to apertures 52 or that extend through apertures 52 without contacting collars 50.

With continued reference to FIG. 3, semiconductor device 10 is connected face down to a higher level substrate 30, such as a carrier substrate. Conductive structures 20 connect contact pads 12 of semiconductor device 10 to corresponding contact pads 32 exposed at surface 34 of substrate 30. As conductive structures 20 are being bonded or otherwise secured to contact pads 32, collar 50 prevents material of conductive structures 20 from contacting regions of surface 14 adjacent to contact pads 12. Moreover, collars 50 contact conductive structures 20 so as to laterally support and protect at least the contacted portions of conductive structures 20.

Figure 4:
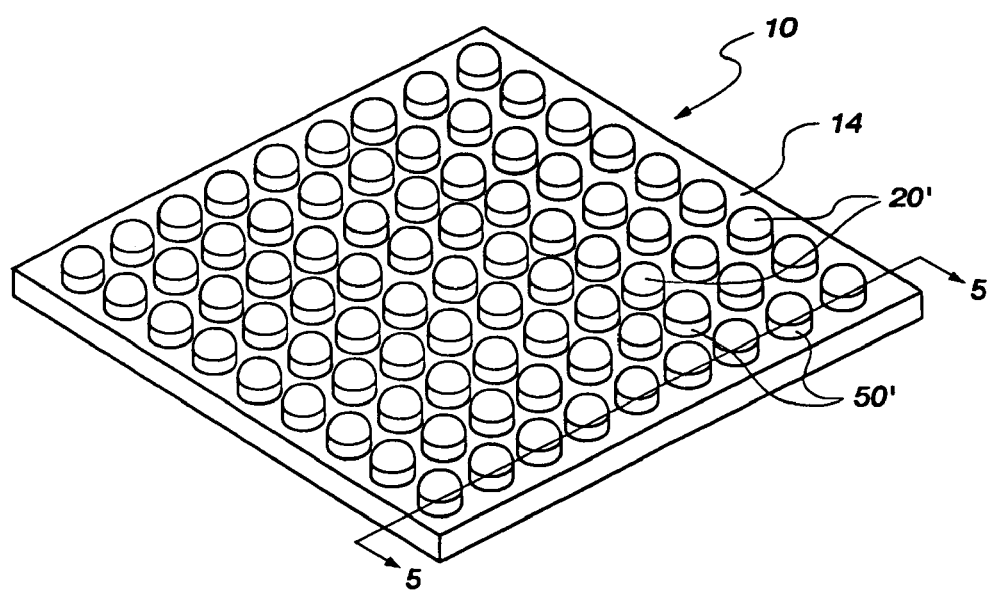
FIG. 4 is an enlarged perspective view of another semiconductor device having collars positioned around the contact pads thereof, each collar laterally surrounding a portion of a conductive structure bonded to the surrounded contact pad.
Figure 5:
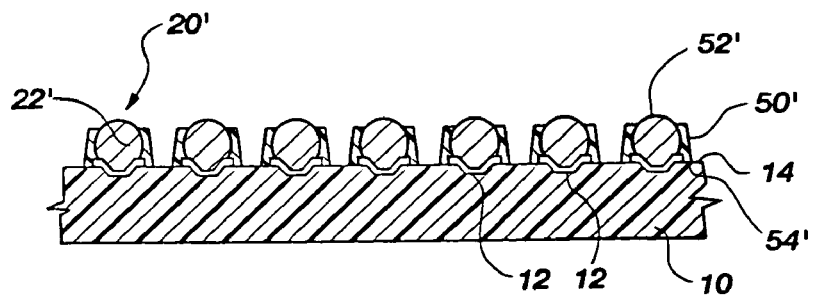
FIG. 5 is a cross-section taken along line 5—5 of FIG. 4, depicting conductive structures extending through and laterally supported by the collars.

FIGS. 4 and 5 illustrate another semiconductor device 10, which has conductive structures 20', shown as solder bumps, protruding from each of the contact pads 12 on the surface 14 thereof. The portion of each conductive structure 20' adjacent surface 14 and the periphery of each contact pad 12 is laterally surrounded by another embodiment of collar 50', which protrudes from surface 14.

As shown in FIG. 5, conductive structure 20' extends through an aperture 52' of collar 50' to contact pad 12. Collar 50' contacts the sides of a base portion 22' of conductive structure 20' that extends through aperture 52'. FIG. 5 also depicts portions of collar 50' located beneath conductive structure 20'. These portions of collar 50' are referred to herein as "shadowed" areas 54'.

Figure 6:
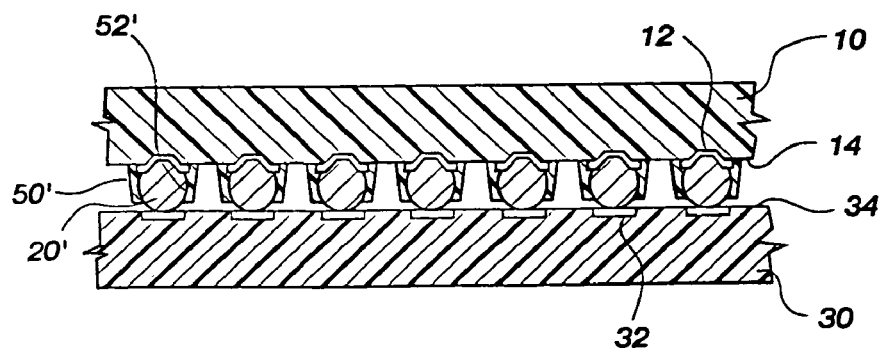
FIG. 6 is a cross-sectional view illustrating the face down connection of the semiconductor device of FIGS. 4 and 5 to a higher level substrate.

Turning now to FIG. 6, semiconductor device 10 is depicted as being invertedly disposed over and connected to a higher level substrate 30. Conductive structures 20' connect each contact pad 12 of semiconductor device 10 to a corresponding contact pad 32 exposed at a surface 34 of substrate 30. As depicted, collars 50' prevent material of conductive structures 20' from contacting surface 14 of semiconductor device 10.

Figure 7:
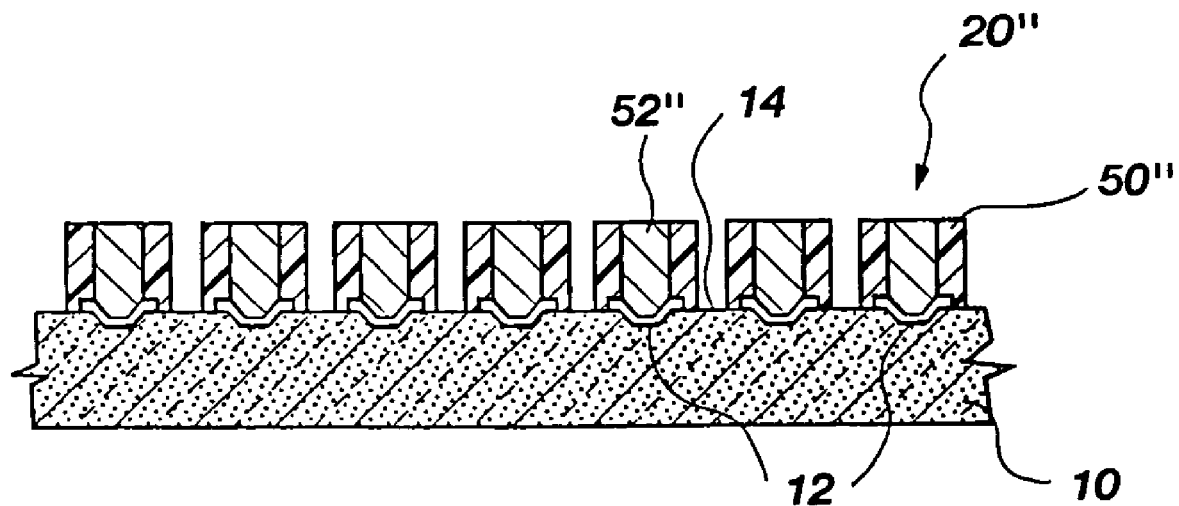
FIG. 7 is a cross-sectional view illustrating a collar protruding the substantial distance of a pillar-shaped conductive structure extending therethrough.

As shown in FIG. 7, a collar 50" can also protrude from surface 14 substantially the same distance as a pillar-shaped conductive structure 20" secured to contact pad 12. When such a collar 50" is fabricated around contact pad 12 before conductive structure 20" is secured thereto, conductive structure 20" can be formed by disposing a quantity of conductive material, such as a solder, metal, metal alloy, conductor filled epoxy, or conductive elastomer, into aperture 52". Alternatively, a pre-formed conductive structure 20" can be secured to contact pad 12 and collar 50" fabricated around conductive structure 20".

It should also be noted that conductive structures 20 (see FIGS. 2 and 3), 20" are thinner than conductive structures 20' (see FIGS. 4–6). Thus, conductive structures 20, 20" consume less area, or real estate, on semiconductor device 10 than conductive structures 20'. Accordingly, conductive structures 20, 20" are spaced farther apart than conductive structures 20'. Furthermore, conductive structures 20, 20" can be used with semiconductor devices having tighter, or smaller, pitches than the pitches of semiconductor devices with which solder balls or similar conductive structures 20' are used. As conductive structures 20, 20" are thinner than solder balls, such as conductive structure 20', conductive structures 20, 20" also consume less conductive material than conductive structures 20'.

Figure 8:
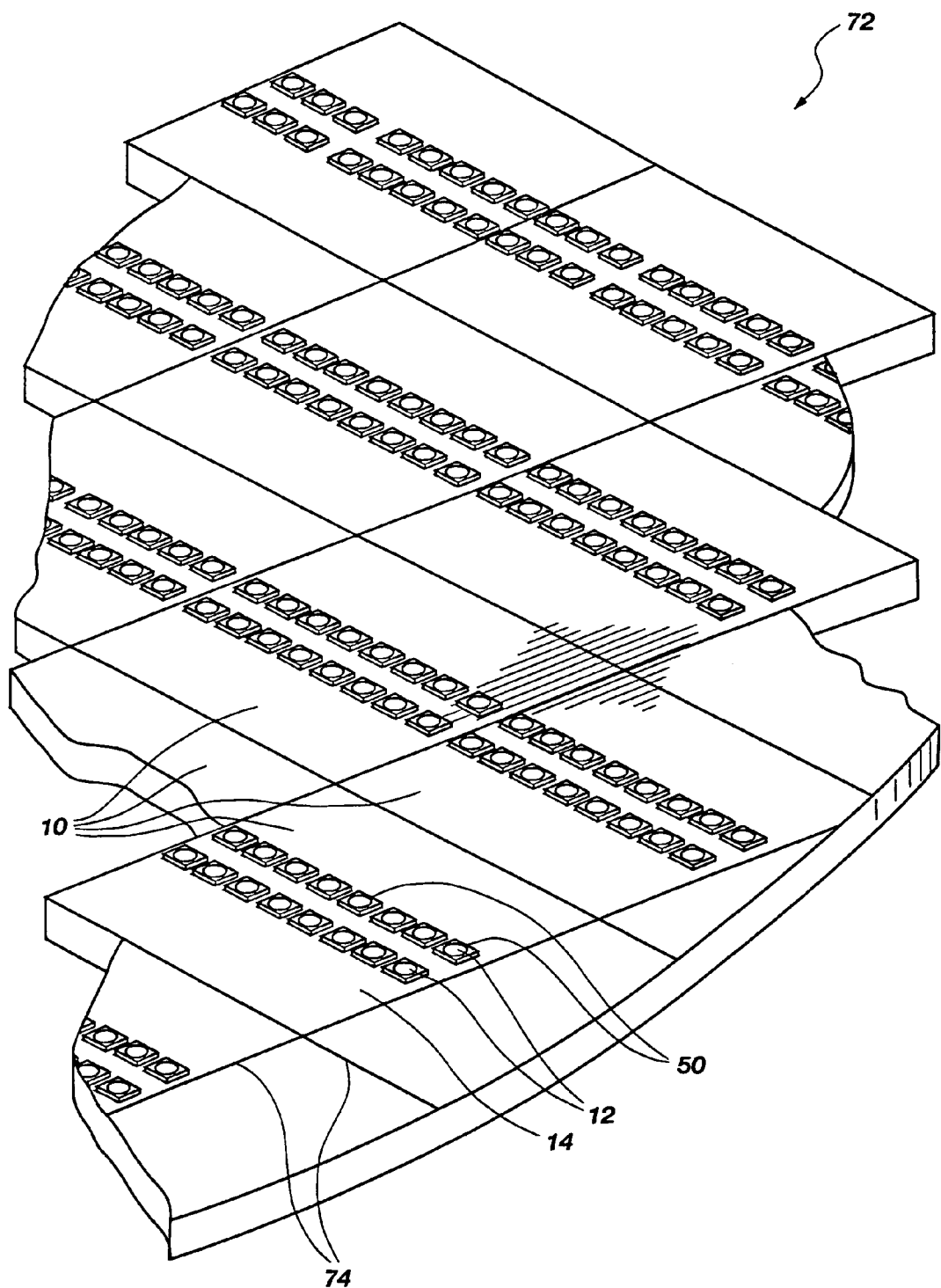
FIG. 8 is a perspective view of a portion of a wafer having a plurality of semiconductor devices thereon, depicting collars being fabricated around each of the contact pads of the semiconductor devices at the wafer level.

FIG. 8 illustrates collars 50 on semiconductor devices 10, in this case semiconductor dice, that have yet to be singulated, or diced, from a wafer 72 or from a portion of a wafer 72. Each semiconductor device 10 on wafer 72 is separated from adjacent semiconductor devices 10 by a street 74 on surface 14.

While collars 50, 50', 50" are preferably substantially simultaneously fabricated on or secured to a collection of semiconductor devices 10, such as prior to singulating semiconductor dice from a wafer 72, collars 50, 50', 50" can also be fabricated on or secured to collections of individual semiconductor devices 10 or other substrates, or to individual semiconductor devices 10 or other substrates, such as substrate 30. As another alternative, collars 50, 50', 50" can be substantially simultaneously fabricated on or secured to a collection of more than one type of semiconductor device 10 or other substrate.

Collars 50, 50', 50" can be fabricated directly on semiconductor devices 10. Alternatively, collars 50, 50', 50" can be fabricated separately from semiconductor devices 10, then secured thereto as known in the art, such as by the use of a suitable adhesive.

Collars 50, 50', 50" are preferably fabricated from a photo-curable polymer, or "photopolymer" by stereolithographic processes. When fabricated directly on a semiconductor device 10, collars 50, 50', 50" can be made either before or after conductive structures 20, 20', 20" are connected to contact pads 12 of semiconductor device 10.

For simplicity, the ensuing description is limited to an explanation of a method of fabricating collars 50 on a semiconductor device 10 prior to securing conductive structures 20 to contact pads 12 of semiconductor device 10. As should be appreciated by those of skill in the art, however, the method described herein is also useful for fabricating collars 50', 50" on semiconductor device 10, as well as for fabricating collars 50, 50', 50" on one or more semiconductor devices 10 or other substrates having conductive structures 20, 20', 20" already secured to the contact pads 12 thereof.

Stereolithography Apparatus and Methods

Figure 9:
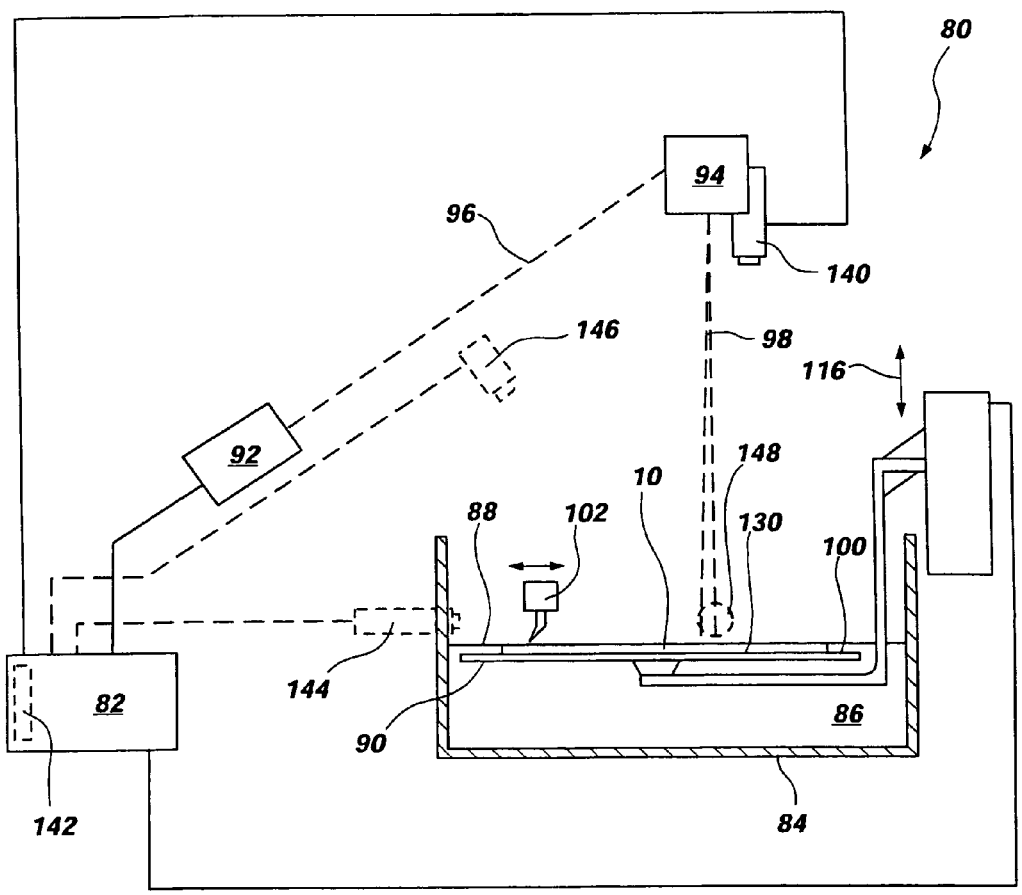
FIG. 9 is a schematic representation of an exemplary stereolithography apparatus that can be employed in the method of the present invention to fabricate the collars of the present invention.

FIG. 9 schematically depicts various components and operation of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States patents assigned to 3-D Systems, Inc., of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 9 and as noted above, a 3-D CAD drawing of an object to be fabricated in the form of a data file is placed in the memory of a computer 82 controlling the operation of apparatus 80 if computer 82 is not a CAD computer in which the original object design is effected. In other words, an object design may be effected in a first computer in an engineering or research facility and the data files transferred via wide or local area network, tape, disc, CD-ROM, or otherwise, as known in the art, to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Apparatus 80 also includes a reservoir 84 (which may comprise a removable reservoir interchangeable with others containing different materials) of an unconsolidated material 86 to be employed in fabricating the intended object. In the currently preferred embodiment, the unconsolidated material 86 is a liquid, photo-curable polymer, or "photopolymer," that cures in response to light in the UV wavelength range. The surface level 88 of material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments in direction 116 responsive to control of computer 82, is located for movement downward into and upward out of material 86 in reservoir 84.

An object may be fabricated directly on platform 90 or on a substrate disposed on platform 90. When the object is to be fabricated on a substrate disposed on platform 90, the substrate may be positioned on platform 90 and secured thereto by way of one or more base supports 122 (see FIG. 10). Such base supports 122 may be fabricated before or simultaneously with the stereolithographic fabrication of one or more objects on platform 90 or a substrate disposed thereon. These supports 122 may support, or prevent lateral movement of, the substrate relative to a surface 100 of platform 90. Supports 122 may also provide a perfectly horizontal reference plane for fabrication of one or more objects thereon, as well as facilitate the removal of a substrate from platform 90 following the stereolithographic fabrication of one or more objects on the substrate. Moreover, where a so-called "recoater" blade 102 is employed to form a layer of material on platform 90 or a substrate disposed thereon, supports 122 can preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect beam 96 downwardly as beam 98 toward surface 100 of platform 90. Beam 98 is traversed in a selected pattern in the X-Y plane, that is to say, in a plane parallel to surface 100, by initiation of the galvanometers under control of computer 82 to at least partially cure, by impingement thereon, selected portions of material 86 disposed over surface 100 to at least a partially consolidated (e.g., semisolid) state. The use of mirror 94 lengthens the path of the laser beam, effectively doubling the same, and provides a more vertical beam 98 than would be possible if the laser 92 itself were mounted directly above platform surface 100, thus enhancing resolution.

Figure 10:
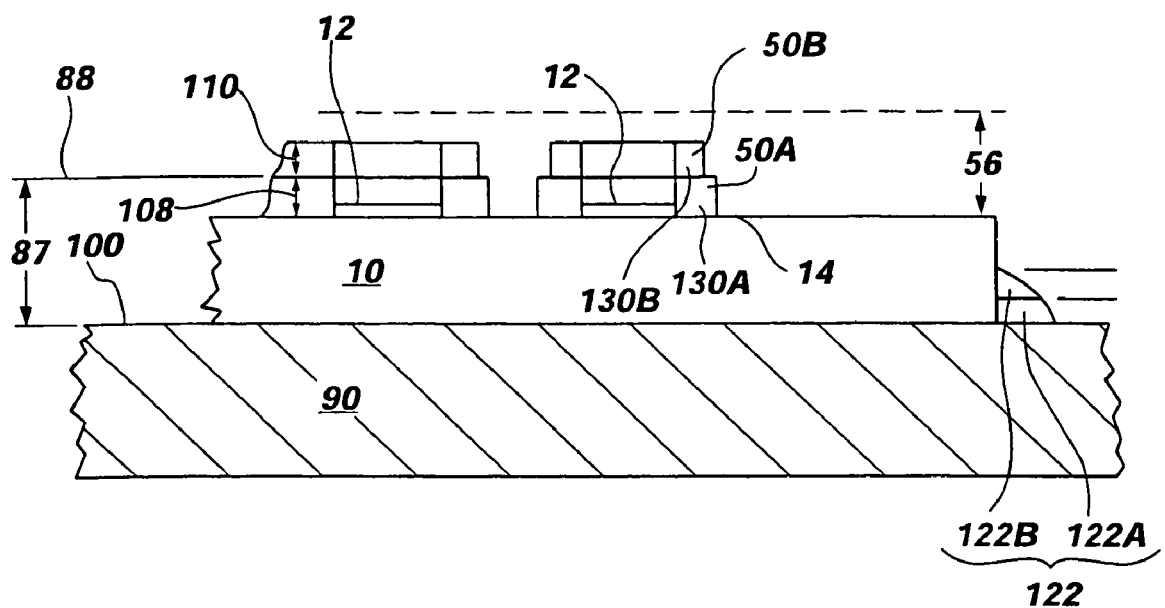
FIG. 10 is a partial cross-sectional side view of a semiconductor device disposed on a platform of a stereolithographic apparatus for the formation of collars around the contact pads of the semiconductor device.

Referring now to FIGS. 9 and 10, data from the STL files resident in computer 82 is manipulated to build an object, such as collar 50, illustrated in FIGS. 1–3 and 8, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, supports 122 may be programmed as a separate STL file from the other objects to be fabricated. The primary STL file for the object or objects to be fabricated and the STL file for base support(s) 122 are merged.

Before fabrication of a first layer for a support 122 or an object to be fabricated is commenced, the operational parameters for apparatus 80 are set to adjust the size (diameter if circular) of the laser light beam used to cure material 86. In addition, computer 82 automatically checks and, if necessary, adjusts by means known in the art, the surface level 88 of material 86 in reservoir 84 to maintain the same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point of laser beam 98 to be located precisely at the surface of material 86 at surface level 88 if level 88 is permitted to vary, although this approach is more complex. Platform 90 may then be submerged in material 86 in reservoir 84 to a depth 87 equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filling in solid portions thereof. Platform 90 is then lowered by a distance equal to thickness of second layer 122B and laser beam 98 scanned over selected regions of the surface of material 86 to define and fill in the second layer while simultaneously bonding the second layer to the first. The process may then be repeated as often as necessary, layer by layer, until base support 122 is completed. Platform 90 is then moved relative to mirror 94 to form any additional base supports 122 on platform 90 or a substrate disposed thereon or to fabricate objects upon platform 90, base support 122, or a substrate, as provided in the control software. The number of layers required to erect support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on platform 90 or a substrate thereon is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and material level 88 are coplanar and the surface of the unconsolidated material 86 is still. Laser 92 is then initiated to scan with laser beam 98 and define the first layer 130A. The process is repeated, layer by layer, to define each succeeding layer 130B and simultaneously bond the same to the next lower layer 130A until all of the layers of the object or objects to be fabricated are completed. A more detailed discussion of this sequence and apparatus for performing the same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over a substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material to define at least the boundaries of the solid regions of the next higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to the practice of the present invention, therefore, no further details relating thereto will be provided herein.

In practicing the present invention, a commercially available stereolithography apparatus operating generally in the manner as that described above with respect to apparatus 80 of FIG. 9 is preferably employed, but with further additions and modifications as hereinafter described for practicing the method of the present invention. For example and not by way of limitation, the SLA-250/50HR, SLA-5000 and SLA-7000 stereolithography systems, each offered by 3-D Systems, Inc., of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness 87 of material 86 to be formed, for purposes of the invention, may be on the order of about 0.0001 to 0.0300 inch, with a high degree of uniformity. It should be noted that different material layers may have different heights so as to form a structure of a precise, intended total height or to provide different material thicknesses for different portions of the structure. The size of the laser beam "spot" impinging on the surface of material 86 to cure the same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure," and being substantially coextensive with the vision field of a machine vision system employed in the apparatus of the invention as explained in more detail below. The longer and more effectively vertical the path of laser beam 96/98, the greater the achievable resolution.

Referring again to FIG. 9, it should be noted that apparatus 80 useful in the method of the present invention includes a camera 140 which is in communication with computer 82 and preferably located, as shown, in close proximity to optics and mirror 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed, as known in the art, to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Collars

In order to facilitate fabrication of one or more collars 50 in accordance with the method of the present invention with apparatus 80, a data file representative of the size, configuration, thickness and surface topography of, for example, a particular type and design of semiconductor device 10 or other substrate upon which one or more collars 50 are to be mounted, is placed in the memory of computer 82. Also, if it is desired that the collars 50 be so positioned on semiconductor device 10 taking into consideration features of a higher level substrate 30 (see FIG. 3) to which semiconductor device 10 is to be connected, a data file representative of substrate 30 and the features thereof may be placed in memory.

One or more semiconductor devices 10, wafers 72 (see FIG. 8), or other substrates may be placed on surface 100 of platform 90 for fabrication of collars 50 around contact pads 12 thereof. If one or more semiconductor devices 10, wafers 72, or other substrates are to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each semiconductor device 10, including those on a wafer 72 (see FIG. 8), or other substrate upon which collars 50 are to be fabricated. The features of each semiconductor device 10, wafer 72, or other substrate are compared with those in the data file residing in memory, the locational and orientational data for each semiconductor device 10, wafer 72, or other substrate then also being stored in memory. It should be noted that the data file representing the design, size, shape and topography for each semiconductor device 10 or other substrate may be used at this juncture to detect physically defective or damaged semiconductor devices 10 or other substrates prior to fabricating collars 50 thereon or before conducting further processing or assembly of semiconductor device 10 or other substrates. Accordingly, such damaged or defective semiconductor devices 10 or other substrates can be deleted from the process of fabricating collars 50, from further processing, or from assembly with other components. It should also be noted that data files for more than one type (size, thickness, configuration, surface topography) of each semiconductor device 10 or other substrate may be placed in computer memory and computer 82 programmed to recognize not only the locations and orientations of each semiconductor device 10 or other substrate, but also the type of semiconductor device 10 or other substrate at each location upon platform 90 so that material 86 may be at least partially consolidated by laser beam 98 in the correct pattern and to the height required to define collars 50 in the appropriate, desired locations on each semiconductor device 10 or other substrate.

Continuing with reference to FIGS. 9 and 10, wafer 72 or the one or more semiconductor devices 10 or other substrates on platform 90 may then be submerged partially below the surface level 88 of liquid material 86 to a depth greater than the thickness of a first layer of material 86 to be at least partially consolidated (e.g., cured to at least a semisolid state) to form the lowest layer 130A of each collar 50 at the appropriate location or locations on each semiconductor device 10 or other substrate, then raised to a depth equal to the layer thickness, surface level 88 of material 86 being allowed to become calm. Photopolymers that are useful as material 86 exhibit a desirable dielectric constant, are of sufficient (i.e., semiconductor grade) purity, exhibit good adherence to other semiconductor device materials, and have a similar coefficient of thermal expansion (CTE) to the material of conductive structures 20 (FIG. 3) (e.g., solder or other metal or metal alloy, or conductive or conductor filled epoxy). Preferably, the CTE of material 86 is sufficiently similar to that of conductive structures 20 to prevent undue stressing thereof during thermal cycling of semiconductor device 10 or another substrate in testing, subsequent processing, and subsequent normal operation. Exemplary photopolymers exhibiting these properties are believed to include, but are not limited to, the above-referenced resins from Ciba Specialty Chemicals Inc. One particular concern in determining resin suitability is the substantial absence of mobile ions, specifically fluorides.

Laser 92 is then activated and scanned to direct beam 98, under control of computer 82, toward specific locations of surface level 88 relative to each semiconductor device 10 or other substrate to effect the aforementioned partial cure of material 86 to form a first layer 50A of each collar 50. Platform 90 is then lowered into reservoir 84 and raised a distance equal to the desired thickness of another layer 50B of each collar 50 and laser 92 is activated to add another layer 50B to each collar 50 under construction. This sequence continues, layer by layer, until each of the layers of collars 50 has been completed.

In FIG. 10, the first layer of collar 50 is identified by numeral 50A and the second layer is identified by numeral 50B. Likewise, the first layer of base support 122 is identified by numeral 122A and the second layer thereof is identified by numeral 122B. As illustrated, both base support 122 and collar 50 have only two layers. Collars 50 with any number of layers are, however, within the scope of the present invention. The use of a large number of layers may be employed to substantially simulate the shape of the outer surface of a conductive structure to be encompassed by collar 50.

Each layer 50A, 50B of collar 50 is preferably built by first defining any internal and external object boundaries of that layer with laser beam 98, then hatching solid areas of collar 50 located within the object boundaries with laser beam 98. An internal boundary of a layer may comprise aperture 52, a through-hole, a void, or a recess in collar 50, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer depends upon the geometry thereof, the surface tension and viscosity of material 86, and the thickness of that layer.

Alternatively, collars 50 may each be formed as a partially cured outer skin extending above surface 14 of semiconductor device 10 and forming a dam within which unconsolidated material 86 can be contained. This may be particularly useful where the collars 50 protrude a relatively high distance 56 from surface 14. In this instance, support platform 90 may be submerged so that material 86 enters the area within the dam, raised above surface level 88, and then laser beam 98 activated and scanned to at least partially cure material 86 residing within the dam or, alternatively, to merely cure a "skin" comprising the contact surface aperture 52, a final cure of the material of the collars 50 being effected subsequently by broad-source UV radiation in a chamber or by thermal cure in an oven. In this manner, collars 50 of extremely precise dimensions may be formed of material 86 by apparatus 80 in minimal time.

When collars 50', depicted in FIGS. 4–6, are being fabricated on a substrate, such as semiconductor device 10, having conductive structures 20' already secured to the contact pads 12 thereof, some of material 86 may be located in shadowed areas 54' (see FIGS. 5 and 6) lying under portions of a conductive structure 20'. As laser beam 98 is directed substantially vertically downwardly toward surface level 88 of material 86, material 86 located in shadowed regions 54' will not be contacted or altered by laser beam 98. Nonetheless, the unconsolidated material 86 in shadowed areas 54' will become trapped therein as material 86 adjacent to, and laterally outward from, shadowed areas 54' is at least partially consolidated as collar 50' is built up around conductive structure 20'. Such trapped, unconsolidated material 86 will eventually cure due to the cross-linking initiated in the outwardly adjacent photopolymer and the cure can be subsequently accelerated as known in the art, such as by a thermal cure.

Once collars 50, or at least the outer skins thereof, have been fabricated, platform 90 is elevated above surface level 88 of material 86 and platform 90 is removed from apparatus 80, along with any substrate (e.g., semiconductor device 10, wafer 72 (see FIG. 8), or other substrate) disposed thereon and any stereolithographically fabricated structures, such as collars 50. Excess, unconsolidated material 86 (e.g., excess uncured liquid) may be manually removed from platform 90, from any substrate disposed thereon, and from collars 50. Each semiconductor device 10, wafer 72, or other substrate is removed from platform 90, such as by cutting the substrate free of base supports 122. Alternatively, base supports 122 may be configured to readily release semiconductor devices 10, wafers 72, or other substrates. As another alternative, a solvent may be employed to release base supports 122 from platform 90. Such release and solvent materials are known in the art. See, for example, U.S. Pat. No. 5,447,822 referenced above and previously incorporated herein by reference.

Collars 50 and semiconductor device 10 may also be cleaned by use of known solvents that will not substantially degrade, deform, or damage collars 50 or a substrate to which collars 50 are secured.

As noted previously, collars 50 may then require postcuring. Collars 50 may have regions of unconsolidated material contained within a boundary or skin thereof or in a shadowed area 54' (see FIGS. 5 and 6), or material 86 may be only partially consolidated (e.g., polymerized or cured) and exhibit only a portion (typically 40% to 60%) of its fully consolidated strength. Postcuring to completely harden collars 50 may be effected in another apparatus projecting UV radiation in a continuous manner over collars 50 or by thermal completion of the initial, UV-initiated partial cure.

It should be noted that the height, shape, or placement of each collar 50 on each specific semiconductor device 10 or other substrate may vary, again responsive to output of camera 140 or one or more additional cameras 144, 146, or 148, shown in broken lines, detecting the protrusion of unusually high (or low) preplaced conductive structures which could affect the desired distance 56 that collars 50 will protrude from surface 14. Likewise, the lateral extent (e.g., diameter) of each preplaced conductive structure may be recognized and the girth of the outer boundary of each collar 50 adjusted accordingly. In any case, laser 92 is again activated to at least partially cure material 86 residing on each semiconductor device 10 or other substrate to form the layer or layers of each collar 50.

Although FIGS. 9 and 10 illustrate the stereolithographic fabrication of collars 50 on a substrate, such as a semiconductor device 10, a wafer 72 (FIG. 8), or another substrate, including a plurality of semiconductor devices 10 or other substrates, collars 50 can be fabricated separately from a substrate, then secured to a substrate, by known processes, such as by the use of a suitable adhesive material.

The use of a stereolithographic process as exemplified above to fabricate collars 50 is particularly advantageous since a large number of collars 50 may be fabricated in a short time, the collar height and position are computer controlled to be extremely precise, wastage of unconsolidated material 86 is minimal, solder coverage of passivation materials is avoided, and the stereolithography method requires minimal handling of semiconductor devices 10, wafers 72, or other substrates.

Stereolithography is also an advantageous method of fabricating collars 50 according to the present invention since stereolithography can be conducted at substantially ambient temperature, the small spot size and rapid traverse of laser beam 98 resulting in negligible thermal stress upon semiconductor devices 10, wafers 72, or other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10 or other substrates 30, variations between individual substrates are accommodated. Accordingly, when the stereolithography method of the present invention is employed, collars 50 can be simultaneously fabricated on different types of semiconductor devices 10 or other substrates, as well as on both semiconductor devices 10 and other substrates.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A collar positionable around a contact pad of a semiconductor device, the collar including an aperture to which at least a portion of the contact pad is exposed, the collar comprising a plurality of mutually adhered regions.

2. The collar of claim 1, being configured to prevent material of a conductive structure securable to the contact pad from contacting a region of a surface of the semiconductor device that surrounds the contact pad.

3. The collar of claim 2, including an inner surface defining the aperture and which is configured to be at least partially contacted by at least a portion of the conductive structure within the aperture.

4. The collar of claim 3, wherein the inner surface is configured to define a shape of at least a portion of the conductive structure.

5. The collar of claim 4, wherein the inner surface is configured to define the conductive structure to have a pillar shape.

6. The collar of claim 4, wherein the inner surface is configured to define at least a base portion of the conductive structure and to impart the conductive structure with a mushroom-like shape.

7. The collar of claim 4, wherein the inner surface is configured to define the conductive structure to have a substantially non-ball-shaped configuration.

8. The collar of claim 1, wherein at least some of the plurality of mutually adhered regions comprise photopolymer.

9. The collar of claim 1, wherein the plurality of mutually adhered regions comprises a plurality of layers.

10. The collar of claim 9, wherein the layers are at least partially superimposed and contiguous.

11. A support structure for a discrete conductive structure, comprising:
a plurality of mutually adhered regions comprising dielectric material; and
a receptacle extending through the plurality of mutually adhered regions and configured to receive at least a portion of the discrete conductive structure.

12. The support structure of claim 11, wherein the plurality of mutually adhered regions is configured to prevent material of the discrete conductive structure from extending laterally beyond a periphery of the receptacle.

13. The support structure of claim 11, wherein each of the plurality of mutually adhered regions comprises photopolymer.

14. The support structure of claim 11, wherein the receptacle is configured to contact at least a portion of an external surface of the discrete conductive structure.

15. The support structure of claim 14, wherein the external surface is configured to define a shape of at least a portion of the discrete conductive structure.

16. The support structure of claim 11, wherein the receptacle is configured to receive substantially all of the discrete conductive structure.

17. The support structure of claim 11, wherein the plurality of mutually adhered regions comprises a plurality of layers.

18. The support structure of claim 17, wherein the layers are at least partially superimposed and contiguous.

19. The support structure of claim 18, wherein the receptacle extends through each layer of the plurality of layers.

20. A form for at least a portion of a discrete conductive structure, comprising:
a body including a plurality of mutually adhered dielectric material regions; and
a receptacle laterally confined by the body, the receptacle having a shape into which at least the portion of the discrete conductive structure is to be formed.

21. The form of claim 20, wherein each of the plurality of mutually adhered dielectric material regions comprises photopolymer.

22. The form of claim 20, wherein the receptacle opens to an end of the body to facilitate communication between the discrete conductive structure and a portion of a contact around which the body is positioned.

23. The form of claim 22, wherein the body prevents material of the portion of the discrete conductive structure from extending laterally beyond an outer periphery of the body.

24. The form of claim 22, wherein the body and the receptacle are configured to facilitate alignment of the discrete conductive structure with the contact.

25. The form of claim 20, wherein the receptacle is configured to form a shape of a substantial length of the discrete conductive structure.

26. The form of claim 20, wherein the plurality of mutually adhered dielectric material regions comprises a plurality of layers.

27. The form of claim 26, wherein the layers are at least partially superimposed and contiguous.

28. The form of claim 27, wherein the receptacle extends through each layer of the plurality of layers.

* * * * *